(12) United States Patent
Li

(10) Patent No.: US 11,307,466 B2
(45) Date of Patent: Apr. 19, 2022

(54) ARRAY SUBSTRATE

(71) Applicant: Shenzhen China Star Optoelectronics Technology Co., Ltd., Shenzhen (CN)

(72) Inventor: Qian Li, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/496,421

(22) PCT Filed: Apr. 18, 2019

(86) PCT No.: PCT/CN2019/083133
§ 371 (c)(1),
(2) Date: Sep. 21, 2019

(87) PCT Pub. No.: WO2020/155411
PCT Pub. Date: Aug. 6, 2020

(65) Prior Publication Data
US 2021/0405424 A1     Dec. 30, 2021

(30) Foreign Application Priority Data

Jan. 29, 2019   (CN) .......................... 201910086223.7

(51) Int. Cl.
*H01L 27/14*     (2006.01)
*G02F 1/136*    (2006.01)
*H01L 27/12*    (2006.01)
*G02F 1/1337*   (2006.01)

(52) U.S. Cl.
CPC .... *G02F 1/13606* (2021.01); *G02F 1/133723* (2013.01); *H01L 27/1248* (2013.01)

(58) Field of Classification Search
CPC ............ H01L 27/1248; H01L 51/0076; H01L 51/107; H01L 51/448; G02F 1/13606; G02F 1/133723
USPC ........................................................... 257/72
See application file for complete search history.

(56) References Cited

U.S. PATENT DOCUMENTS

| | | | |
|---|---|---|---|
| 6,271,119 B1 | 8/2001 | Kishimoto | |
| 2003/0211649 A1* | 11/2003 | Hirai | ...................... H01L 27/283 438/48 |
| 2008/0150044 A1* | 6/2008 | Hirai | .................. H01L 51/0525 257/401 |
| 2012/0153285 A1* | 6/2012 | James | .................. H01L 51/107 257/57 |
| 2014/0240628 A1 | 8/2014 | Chen | |
| 2016/0231629 A1 | 8/2016 | Xu | |
| 2017/0365622 A1 | 12/2017 | Yuan et al. | |

FOREIGN PATENT DOCUMENTS

| | | |
|---|---|---|
| CN | 1229273 A | 9/1999 |
| CN | 101221328 A | 7/2008 |
| CN | 101995713 A | 3/2011 |

(Continued)

*Primary Examiner* — Brook Kebede
(74) *Attorney, Agent, or Firm* — Nathan & Associates; Menachem Nathan

(57) ABSTRACT

The array substrate of embodiments of the present invention uses the adjustment dielectric layer to reduce parasitic capacitance between the gate metal layer and the electrode layer, thus avoiding the dark streak phenomenon due to the fringing electric field and the surrounding environment and improving display quality.

20 Claims, 2 Drawing Sheets

(56) References Cited

FOREIGN PATENT DOCUMENTS

| CN | 103824866 A | 5/2014 |
|---|---|---|
| CN | 104730782 A | 6/2015 |
| CN | 105140237 A | 12/2015 |
| CN | 107085335 A | 8/2017 |

* cited by examiner

ARRAY SUBSTRATE

FIELD OF INVENTION

The present invention is related to a display technology field, and specifically to an array substrate.

BACKGROUND OF INVENTION

The High Vertical Alignment (HVA) mode is mainly about that the negative liquid crystals are rotated by the electric field during the application of a bias thereto. A polymer film layer is formed on the alignment film after being irradiated by the ultraviolet light. The liquid crystals each are formed with a specific pretilt angle on the alignment film through the HVA process.

The general array substrate has metal traces in the opening region of the pixel electrode. During the application of the bias to the array substrate and the color film substrate and, at the same time, the curing of the liquid crystals of the HVA process, a fringing electric field is generated, which interferes with the rotation and alignment effect of the liquid crystals. Because of the fringing electric field and the surrounding environment, the display will appear the dark streak phenomenon.

SUMMARY OF INVENTION

The purpose of embodiments of the present invention is to provide an array substrate, in order to solve the technical problem of the dark streak phenomenon due to the fringing electric field and the surrounding environment.

The embodiment of the present invention provides an array substrate, comprising:

a substrate;

a gate metal layer, the gate metal layer disposed on the substrate;

an interlayer dielectric layer, the interlayer dielectric layer disposed on the substrate and the gate metal layer;

an electrode layer, the electrode layer disposed on the interlayer dielectric layer;

an alignment layer, the alignment layer disposed on the electrode layer, the alignment layer being a polyimide (PI) layer; and an adjustment dielectric layer, the adjustment dielectric layer disposed between the gate metal layer and the alignment layer and connecting with the interlayer dielectric layer and the electrode layer, the adjustment dielectric layer being provided for reducing parasitic capacitance between the gate metal layer and the electrode layer.

The array substrate described in the present invention wherein a dielectric constant of the adjustment dielectric layer is lower than a dielectric constant of the interlayer dielectric layer; and wherein the adjustment dielectric layer is disposed on the substrate and covers the gate metal layer, the upper surface of the adjustment dielectric layer connects with the lower surface of the electrode layer and the lower surface of the alignment layer, and the adjustment dielectric layer is surrounded by the interlayer dielectric layer.

The array substrate described in the present invention wherein the dielectric constant of the adjustment dielectric layer is 2-4.

The array substrate described in the present invention wherein the adjustment dielectric layer is made of photoresist.

The array substrate described in the present invention wherein the adjustment dielectric layer is made by coating photoresist and processing the photoresist by photolithography.

The array substrate described in the present invention wherein the dielectric constant of the adjustment dielectric layer is higher than the dielectric constant of the interlayer dielectric layer; and wherein the adjustment dielectric layer is opposite to the gate metal layer, the adjustment dielectric layer is disposed on the interlayer dielectric layer, the adjustment dielectric layer is surrounded by the electrode layer, and the upper surface of the adjustment dielectric layer connects with the lower surface of the alignment layer.

The array substrate described in the present invention wherein the dielectric constant of the adjustment dielectric layer is higher than 10.

The array substrate described in the present invention wherein the interlayer dielectric layer is a silicon nitride layer.

The array substrate described in the present invention wherein the adjustment dielectric layer comprises a first adjustment dielectric layer and a second adjustment dielectric layer;

wherein the second adjustment dielectric layer is disposed on the substrate and covers the gate metal layer, the upper surface of the second adjustment dielectric layer connects with the lower surface of the electrode layer and the lower surface of the first adjustment dielectric layer, the second adjustment dielectric layer is surrounded by the interlayer dielectric layer, and a dielectric constant of the second adjustment dielectric layer is lower than the dielectric constant of the interlayer dielectric layer;

wherein the first adjustment dielectric layer is opposite to the gate metal layer, the first adjustment dielectric layer is disposed on the second adjustment dielectric layer, and the first adjustment dielectric layer is surrounded by the electrode layer, and the upper surface of the first adjustment dielectric layer connects with the lower surface of the alignment layer; and wherein a dielectric constant of the first adjustment dielectric layer is higher than the dielectric constant of the interlayer dielectric layer.

The array substrate described in the present invention wherein the second adjustment dielectric layer is a silicon nitride layer, and the dielectric constant of the second adjustment dielectric layer is 6-8; and wherein the first adjustment dielectric layer is made of non-metallic insulating material having a dielectric constant higher than 10.

The embodiment of the present invention also provides an array substrate, comprising:

a substrate;

a gate metal layer, the gate metal layer disposed on the substrate;

an interlayer dielectric layer, the interlayer dielectric layer disposed on the substrate and the gate metal layer;

an electrode layer, the electrode layer disposed on the interlayer dielectric layer;

an alignment layer, the alignment layer disposed on the electrode layer; and an adjustment dielectric layer, the adjustment dielectric layer disposed between the gate metal layer and the alignment layer and connecting with the interlayer dielectric layer and the electrode layer, the adjustment dielectric layer being provided for reducing parasitic capacitance between the gate metal layer and the electrode layer.

The array substrate described in the present invention wherein a dielectric constant of the adjustment dielectric layer is lower than a dielectric constant of the interlayer dielectric layer; and wherein the adjustment dielectric layer is disposed on the substrate and covers the gate metal layer, the upper surface of the adjustment dielectric layer connects with the lower surface of the electrode layer and the lower surface of the alignment layer, and the adjustment dielectric layer is surrounded by the interlayer dielectric layer.

The array substrate described in the present invention wherein the dielectric constant of the adjustment dielectric layer is 2-4.

The array substrate described in the present invention wherein the adjustment dielectric layer is made of photoresist.

The array substrate described in the present invention wherein the adjustment dielectric layer is made by coating photoresist and processing the photoresist by photolithography.

The array substrate described in the present invention wherein the dielectric constant of the adjustment dielectric layer is higher than the dielectric constant of the interlayer dielectric layer; and wherein the adjustment dielectric layer is opposite to the gate metal layer, the adjustment dielectric layer is disposed on the interlayer dielectric layer, the adjustment dielectric layer is surrounded by the electrode layer, and the upper surface of the adjustment dielectric layer connects with the lower surface of the alignment layer.

The array substrate described in the present invention wherein the dielectric constant of the adjustment dielectric layer is higher than 10.

The array substrate described in the present invention wherein the interlayer dielectric layer is a silicon nitride layer.

The array substrate described in the present invention wherein the adjustment dielectric layer comprises a first adjustment dielectric layer and a second adjustment dielectric layer;

wherein the second adjustment dielectric layer is disposed on the substrate and covers the gate metal layer, the upper surface of the second adjustment dielectric layer connects with the lower surface of the electrode layer and the lower surface of the first adjustment dielectric layer, the second adjustment dielectric layer is surrounded by the interlayer dielectric layer, and a dielectric constant of the second adjustment dielectric layer is lower than the dielectric constant of the interlayer dielectric layer;

wherein the first adjustment dielectric layer is opposite to the gate metal layer, the first adjustment dielectric layer is disposed on the second adjustment dielectric layer, and the first adjustment dielectric layer is surrounded by the electrode layer, and the upper surface of the first adjustment dielectric layer connects with the lower surface of the alignment layer; and wherein a dielectric constant of the first adjustment dielectric layer is higher than the dielectric constant of the interlayer dielectric layer.

The array substrate described in the present invention wherein the second adjustment dielectric layer is a silicon nitride layer, and the dielectric constant of the second adjustment dielectric layer is 6-8; and wherein the first adjustment dielectric layer is made of non-metallic insulating material having a dielectric constant higher than 10.

The array substrate of embodiments of the present invention uses the adjustment dielectric layer to reduce parasitic capacitance between the gate metal layer and the electrode layer, thus avoiding the dark streak phenomenon due to the fringing electric field and the surrounding environment and improving display quality.

DESCRIPTION OF DRAWINGS

In order to describe technical solutions in the present invention clearly, drawings to be used in the description of embodiments will be described briefly below. Apparently, drawings described below are only for some embodiments of the present invention, and other drawings may be obtained by those skilled in the art based on these drawings without creative efforts.

DETAILED DESCRIPTION

Figure 1:
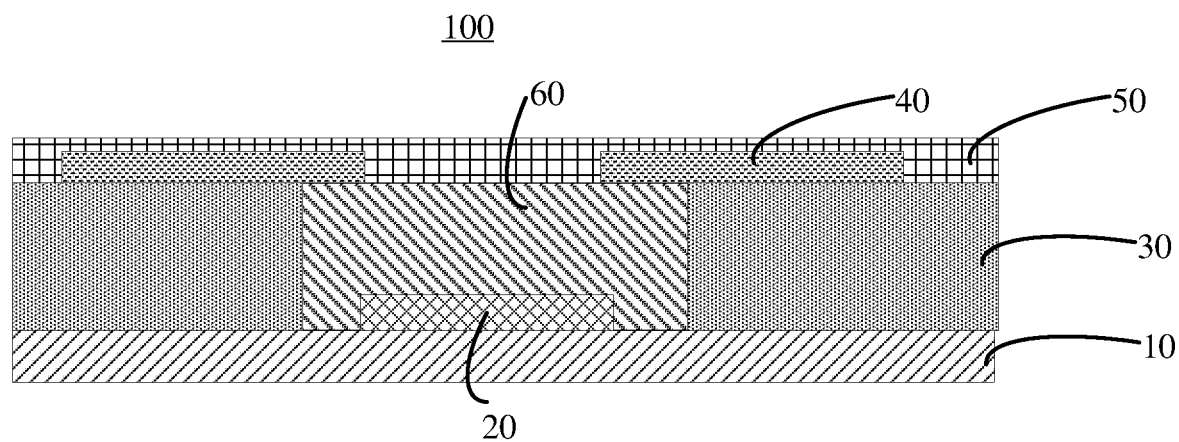
FIG. 1 is a first structural diagram of an array substrate provided by embodiments of the present invention.

The specific structural and functional details disclosed herein are merely representative and are intended to describe the purpose of the exemplary embodiments of the present invention. The present invention may be embodied in many substituted forms and should not be construed as limited to the embodiments set forth herein only.

In the description of the present invention, it is to be understood that the terms "center", "transverse", "up", "down", "left", "right", "vertical", "horizontal", "top", "bottom", "inside", "outside", and the like, indicate orientations or positional relationships, and are based on the orientations or positional relationships shown in the drawings, merely for the purpose of facilitating the description of the present invention and the simplified description, rather than indicating or implying that the devices or elements have to have a specific orientation, or be constructed and operated in a particular orientation, and therefore may not be construed as limits to the present invention. In addition, the terms "first" and "second" are merely used for illustrative purposes only, but are not to be construed as indicating or imposing a relative importance or implicitly indicating the number of technical features indicated. Thus, a feature that defines "first" or "second" may expressly or implicitly comprise one or more of the features. In the description of the present invention, the meaning of "plural" is two or more, unless otherwise specified. In addition, the terms "comprising" and any variations thereof are intended to cover a non-exclusive inclusion.

In the description of the present invention, it should be noted that, unless otherwise expressly stated and defined, the terms "installation", "interconnection", and "connection", should be broadly understood; for example, it may be a fixed connection, either a detachable connection or integral connection; it may be a mechanical connection or an electrical connection; it may be a direct connection or an indirect connection via an intermediate medium, or internal connection between two devices. The specific meaning of the above terms of the present invention will be apparent to those skilled in the art.

The terminology used herein is for the purpose of describing particular embodiments only and is not intended to limit the exemplary embodiments. Unless the context clearly dictates otherwise, the singular forms "a" and "an", as used herein, are also intended to include the plural. It should also be understood that the terms "comprise" and/or "include" both mean a presence of characteristics, integers, steps, operations, units and/or components stated in the specification, and do not exclude the presence or addition of one or more other features, integers, operations, units, components and/or combinations thereof.

The embodiment of the present invention provides an array substrate, comprising: a substrate; a gate metal layer, the gate metal layer disposed on the substrate; an interlayer dielectric layer, the interlayer dielectric layer disposed on the substrate and the gate metal layer; an electrode layer, the electrode layer disposed on the interlayer dielectric layer; an alignment layer, the alignment layer disposed on the electrode layer; and an adjustment dielectric layer, the adjustment dielectric layer disposed between the gate metal layer and the alignment layer and connecting with the interlayer dielectric layer and the electrode layer, the adjustment dielectric layer being provided for reducing parasitic capacitance between the gate metal layer and the electrode layer.

An embodiment refers to FIG. 1, which is a first structural diagram of an array substrate provided by embodiments of the present invention. As shown in FIG. 1, the array substrate 100 includes a substrate 10, a gate metal layer 20, an interlayer dielectric layer 30, an electrode layer 40, an alignment layer 50, and an adjustment dielectric layer 60.

The gate metal layer 20 is disposed on the substrate 10. The interlayer dielectric layer 30 is disposed on the substrate 10 and the gate metal layer 20. The electrode layer 40 is disposed on the interlayer dielectric layer 30. The alignment layer 50 is disposed on the electrode layer 40. The adjustment dielectric layer 60 is disposed on the substrate 10 and covers the gate metal layer 20. The upper surface of the adjustment dielectric layer 60 connects with the lower surface of the electrode layer 40 and the lower surface of the alignment layer 50. The adjustment dielectric layer 60 is surrounded by the interlayer dielectric layer 30.

In this embodiment, a dielectric constant of the adjustment dielectric layer 60 is lower than a dielectric constant of the interlayer dielectric layer 30. The interlayer dielectric layer 30 is a silicon nitride layer having a dielectric constant of 6-8. The dielectric constant of the adjustment dielectric layer 60 is 2-4. The adjustment dielectric layer 60 can be made of photoresist. The adjustment dielectric layer 60 is made by coating photoresist and processing the photoresist by photolithography. The alignment layer 50 is a polyimide (PI) layer. The alignment layer 50 is used for aligning the liquid crystal layer.

The adjustment dielectric layer 60 is provided for reducing parasitic capacitance between the gate metal layer 20 and the electrode layer 40 and improving display quality. The gate metal layer 20 is made of metal material and formed by physical vapor deposition. The interlayer dielectric layer 30 is formed by chemical vapor deposition, and of course, in addition to silicon nitride material, the interlayer dielectric layer 30 can also be made of silicon dioxide material.

The electrode layer 40 includes a plurality of electrodes functioning as the pixel electrodes of the array substrate 100. The electrode layer 40 can be made of indium tin oxide (ITO). When forming the electrode layer 40, an ITO deposition process is used first to form an ITO layer, and, then, the ITO layer is patterned by photolithography to get the plurality of pixel electrodes.

The array substrate 100 of embodiments of the present invention uses the adjustment dielectric layer 60 to reduce parasitic capacitance between the gate metal layer 20 and the electrode layer 40, thus avoiding the dark streak phenomenon due to the fringing electric field and the surrounding environment and improving display quality.

Figure 2:
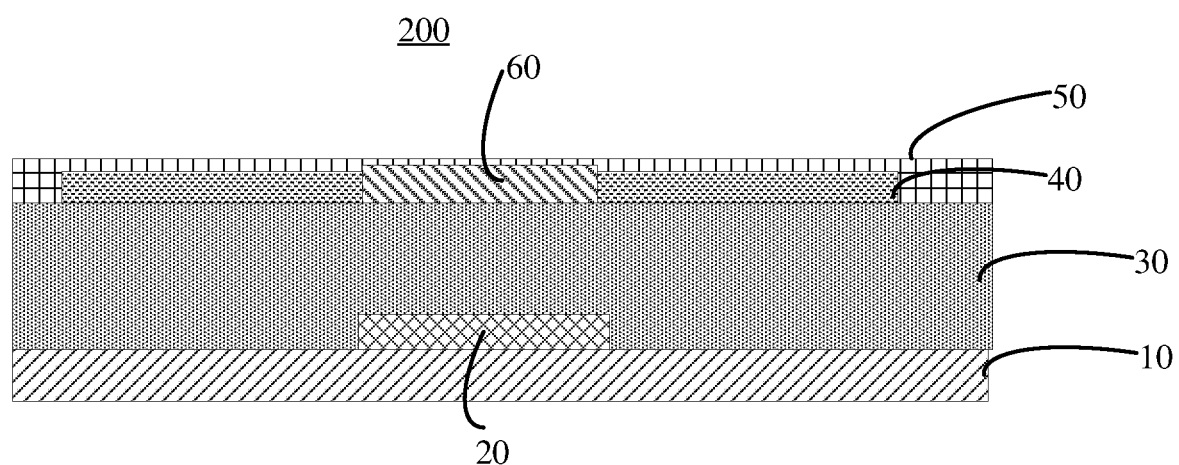
FIG. 2 is a second structural diagram of the array substrate provided by embodiments of the present invention.

The other embodiment refers to FIG. 2, which is a second structural diagram of an array substrate provided by embodiments of the present invention. As shown in FIG. 2, the array substrate 200 includes a substrate 10, a gate metal layer 20, an interlayer dielectric layer 30, an electrode layer 40, an alignment layer 50, and an adjustment dielectric layer 60.

The gate metal layer 20 is disposed on the substrate 10. The interlayer dielectric layer 30 is disposed on the substrate 10 and the gate metal layer 20. The electrode layer 40 is disposed on the interlayer dielectric layer 30. The adjustment dielectric layer 60 is opposite to the gate metal layer 20. The adjustment dielectric layer 60 is disposed on the interlayer dielectric layer 30, the adjustment dielectric layer 60 is surrounded by the electrode layer 40, and the upper surface of the adjustment dielectric layer 60 connects with the lower surface of the alignment layer 50.

In this embodiment, a dielectric constant of the adjustment dielectric layer 60 is higher than a dielectric constant of the interlayer dielectric layer 30. The interlayer dielectric layer 30 is a silicon nitride layer having a dielectric constant of 6-8. The dielectric constant of the adjustment dielectric layer 60 is higher than 10, and the adjustment dielectric layer 60 can be made of non-metallic insulating material having a dielectric constant higher than 10. The alignment layer 50 is a polyimide (PI) layer. The alignment layer 50 is used for aligning the liquid crystal layer.

The adjustment dielectric layer 60 is provided for reducing parasitic capacitance between the gate metal layer 20 and the electrode layer 40 and improving display quality. The gate metal layer 20 is made of metal material and formed by physical vapor deposition. The interlayer dielectric layer 30 is formed by chemical vapor deposition, and of course, in addition to silicon nitride material, the interlayer dielectric layer 30 can also be made of silicon dioxide material.

The electrode layer 40 includes a plurality of electrodes functioning as the pixel electrodes of the array substrate 200. The electrode layer 40 can be made of indium tin oxide (ITO). When forming the electrode layer 40, an ITO deposition process is used first to form an ITO layer, and, then, the ITO layer is patterned by photolithography to get a plurality of pixel electrodes.

The array substrate 200 of embodiments of the present invention uses the adjustment dielectric layer 60 to reduce parasitic capacitance between the gate metal layer 20 and the electrode layer 40, thus avoiding the dark streak phenomenon due to the fringing electric field and the surrounding environment and improving display quality.

Figure 3:
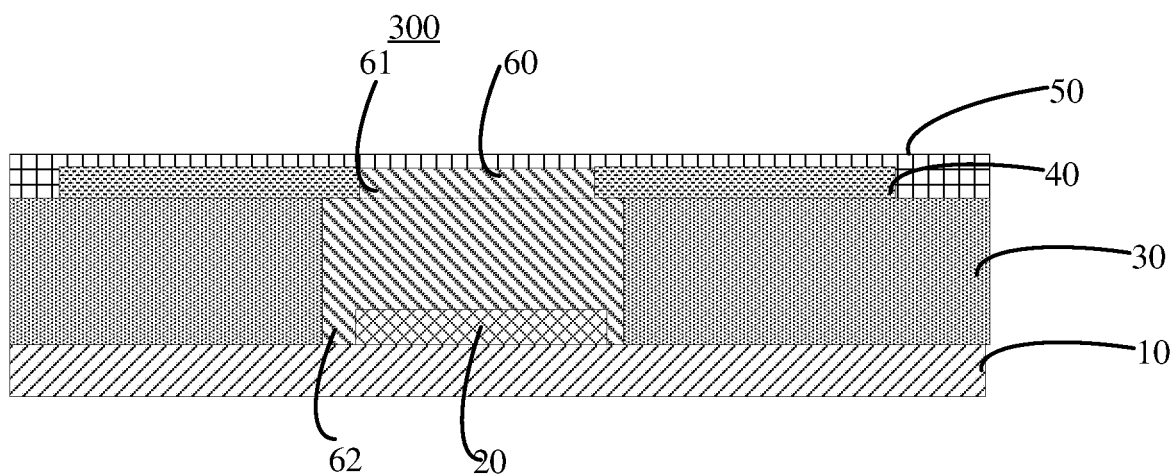
FIG. 3 is a third structural diagram of the array substrate provided by embodiments of the present invention.

The other embodiment refers to FIG. 3, which is a third structural diagram of an array substrate provided by embodiments of the present invention. As shown in FIG. 3, the array substrate 300 includes a substrate 10, a gate metal layer 20, an interlayer dielectric layer 30, an electrode layer 40, an alignment layer 50, and an adjustment dielectric layer 60.

The gate metal layer 20 is disposed on the substrate 10. The interlayer dielectric layer 30 is disposed on the substrate 10 and the gate metal layer 20. The electrode layer 40 is disposed on the interlayer dielectric layer 30. The alignment layer 50 is disposed on the electrode layer 40.

Further, the adjustment dielectric layer 60 comprises a first adjustment dielectric layer 61 and a second adjustment dielectric layer 62. The second adjustment dielectric layer 62 is disposed on the substrate 10 and covers the gate metal layer 20. The upper surface of the second adjustment dielectric layer 62 connects with the lower surface of the electrode layer 40 and the lower surface of the first adjustment dielectric layer 61, the second adjustment dielectric layer 62 is surrounded by the interlayer dielectric layer 30. A dielectric constant of the second adjustment dielectric layer 62 is lower than the dielectric constant of the interlayer dielectric layer 30. The second adjustment dielectric layer 62 is a silicon nitride layer having a dielectric constant of 6-8.

The first adjustment dielectric layer 61 is opposite to the gate metal layer 20, the first adjustment dielectric layer 61 is disposed on the second adjustment dielectric layer 62, and the first adjustment dielectric layer 61 is surrounded by the electrode layer 40, and the upper surface of the first adjustment dielectric layer 61 connects with the lower surface of the alignment layer 50. The first adjustment dielectric layer 61 is made of non-metallic insulating material having a dielectric constant higher than 10.

The adjustment dielectric layer 60 is provided for reducing parasitic capacitance between the gate metal layer 20 and the electrode layer 40.

The array substrate 300 of embodiments of the present invention uses the adjustment dielectric layer 60 to reduce parasitic capacitance between the gate metal layer 20 and the electrode layer 40, thus avoiding the dark streak phenomenon due to the fringing electric field and the surrounding environment and improving display quality.

The array substrate provided by embodiments of the present invention is described in detail above, the specific examples of this document are used to explain principles and embodiments of the present invention, and the description of embodiments above is only for helping to understand the present invention. Meanwhile, those skilled in the art will be able to change the specific embodiments and the scope of the invention according to the idea of the present invention. In the above, the content of the specification should not be construed as limiting the present invention. Above all, the content of the specification should not be the limitation of the present invention.

What is claimed is:

1. An array substrate, comprising:
   a substrate;
   a gate metal layer, the gate metal layer disposed on the substrate;
   an interlayer dielectric layer, the interlayer dielectric layer disposed on the substrate and the gate metal layer;
   an electrode layer, the electrode layer disposed on the interlayer dielectric layer;
   an alignment layer, the alignment layer disposed on the electrode layer, the alignment layer being a polyimide (PI) layer; and
   an adjustment dielectric layer, the adjustment dielectric layer disposed between the gate metal layer and the alignment layer and connecting with the interlayer dielectric layer and the electrode layer, the adjustment dielectric layer being provided for reducing parasitic capacitance between the gate metal layer and the electrode layer.

2. The array substrate as claimed in claim 1, wherein a dielectric constant of the adjustment dielectric layer is lower than a dielectric constant of the interlayer dielectric layer; and
   wherein the adjustment dielectric layer is disposed on the substrate and covers the gate metal layer, the upper surface of the adjustment dielectric layer connects with the lower surface of the electrode layer and the lower surface of the alignment layer, and the adjustment dielectric layer is surrounded by the interlayer dielectric layer.

3. The array substrate as claimed in claim 2, wherein the dielectric constant of the adjustment dielectric layer is 2-4.

4. The array substrate as claimed in claim 3, wherein the adjustment dielectric layer is made of photoresist.

5. The array substrate as claimed in claim 4, wherein the adjustment dielectric layer is made by coating photoresist and processing the photoresist by photolithography.

6. The array substrate as claimed in claim 1, wherein the dielectric constant of the adjustment dielectric layer is higher than the dielectric constant of the interlayer dielectric layer; and
   wherein the adjustment dielectric layer is opposite to the gate metal layer, the adjustment dielectric layer is disposed on the interlayer dielectric layer, the adjustment dielectric layer is surrounded by the electrode layer, and the upper surface of the adjustment dielectric layer connects with the lower surface of the alignment layer.

7. The array substrate as claimed in claim 6, wherein the dielectric constant of the adjustment dielectric layer is higher than 10.

8. The array substrate as claimed in claim 1, wherein the interlayer dielectric layer is a silicon nitride layer.

9. The array substrate as claimed in claim 1, wherein the adjustment dielectric layer comprises a first adjustment dielectric layer and a second adjustment dielectric layer;
   wherein the second adjustment dielectric layer is disposed on the substrate and covers the gate metal layer, the upper surface of the second adjustment dielectric layer connects with the lower surface of the electrode layer and the lower surface of the first adjustment dielectric layer, the second adjustment dielectric layer is surrounded by the interlayer dielectric layer, and a dielectric constant of the second adjustment dielectric layer is lower than the dielectric constant of the interlayer dielectric layer;
   wherein the first adjustment dielectric layer is opposite to the gate metal layer, the first adjustment dielectric layer is disposed on the second adjustment dielectric layer, and the first adjustment dielectric layer is surrounded by the electrode layer, and the upper surface of the first adjustment dielectric layer connects with the lower surface of the alignment layer; and
   wherein a dielectric constant of the first adjustment dielectric layer is higher than the dielectric constant of the interlayer dielectric layer.

10. The array substrate as claimed in claim 9, wherein the second adjustment dielectric layer is a silicon nitride layer, and the dielectric constant of the second adjustment dielectric layer is 6-8; and
    wherein the first adjustment dielectric layer is made of non-metallic insulating material having a dielectric constant higher than 10.

11. An array substrate, comprising:
    a substrate;
    a gate metal layer, the gate metal layer disposed on the substrate;
    an interlayer dielectric layer, the interlayer dielectric layer disposed on the substrate and the gate metal layer;
    an electrode layer, the electrode layer disposed on the interlayer dielectric layer;
    an alignment layer, the alignment layer disposed on the electrode layer; and an adjustment dielectric layer, the adjustment dielectric layer disposed between the gate metal layer and the alignment layer and connecting with the interlayer dielectric layer and the electrode layer, the adjustment dielectric layer being provided for reducing parasitic capacitance between the gate metal layer and the electrode layer.

12. The array substrate as claimed in claim 11, wherein a dielectric constant of the adjustment dielectric layer is lower than a dielectric constant of the interlayer dielectric layer; and wherein the adjustment dielectric layer is disposed on the substrate and covers the gate metal layer, the upper surface of the adjustment dielectric layer connects with the lower surface of the electrode layer and the lower surface of the alignment layer, and the adjustment dielectric layer is surrounded by the interlayer dielectric layer.

13. The array substrate as claimed in claim 12, wherein the dielectric constant of the adjustment dielectric layer is 2-4.

14. The array substrate as claimed in claim 13, wherein the adjustment dielectric layer is made of photoresist.

15. The array substrate as claimed in claim 14, wherein the adjustment dielectric layer is made by coating photoresist and processing the photoresist by photolithography.

16. The array substrate as claimed in claim 11, wherein the dielectric constant of the adjustment dielectric layer is higher than the dielectric constant of the interlayer dielectric layer; and wherein the adjustment dielectric layer is opposite to the gate metal layer, the adjustment dielectric layer is disposed on the interlayer dielectric layer, the adjustment dielectric layer is surrounded by the electrode layer, and the upper surface of the adjustment dielectric layer connects with the lower surface of the alignment layer.

17. The array substrate as claimed in claim 16, wherein the dielectric constant of the adjustment dielectric layer is higher than 10.

18. The array substrate as claimed in claim 11, wherein the interlayer dielectric layer is a silicon nitride layer.

19. The array substrate as claimed in claim 11, wherein the adjustment dielectric layer comprises a first adjustment dielectric layer and a second adjustment dielectric layer;

wherein the second adjustment dielectric layer is disposed on the substrate and covers the gate metal layer, the upper surface of the second adjustment dielectric layer connects with the lower surface of the electrode layer and the lower surface of the first adjustment dielectric layer, the second adjustment dielectric layer is surrounded by the interlayer dielectric layer, and a dielectric constant of the second adjustment dielectric layer is lower than the dielectric constant of the interlayer dielectric layer;

wherein the first adjustment dielectric layer is opposite to the gate metal layer, the first adjustment dielectric layer is disposed on the second adjustment dielectric layer, and the first adjustment dielectric layer is surrounded by the electrode layer, and the upper surface of the first adjustment dielectric layer connects with the lower surface of the alignment layer; and wherein a dielectric constant of the first adjustment dielectric layer is higher than the dielectric constant of the interlayer dielectric layer.

20. The array substrate as claimed in claim 19, wherein the second adjustment dielectric layer is a silicon nitride layer, and the dielectric constant of the second adjustment dielectric layer is 6-8; and wherein the first adjustment dielectric layer is made of non-metallic insulating material having a dielectric constant higher than 10.

* * * * *